United States Patent [19]
Freker

[11] Patent Number: 6,041,016
[45] Date of Patent: Mar. 21, 2000

[54] OPTIMIZING PAGE SIZE IN MIXED MEMORY ARRAY USING ADDRESS MULTIPLEXING

[75] Inventor: David E. Freker, Sacramento, Calif.

[73] Assignee: Intel Corporation, Santa Clara, Calif.

[21] Appl. No.: 09/205,509

[22] Filed: Dec. 4, 1998

[51] Int. Cl.[7] ............................................. G11C 8/00
[52] U.S. Cl. ........................ 365/238.5; 365/230.02; 365/230.03
[58] Field of Search .......................... 365/238.5, 230.02, 365/230.03

[56] References Cited

U.S. PATENT DOCUMENTS

| | | | |
|---|---|---|---|
| 5,047,989 | 9/1991 | Canepa et al. ..................... | 365/238.5 |
| 5,452,257 | 9/1995 | Han ..................................... | 365/238.5 X |
| 5,488,711 | 1/1996 | Hewitt et al. ..................... | 365/238.5 X |
| 5,841,715 | 11/1998 | Farmwald et al. ............... | 365/238.5 X |

*Primary Examiner*—Do Hyun Yoo
*Attorney, Agent, or Firm*—Blakely, Sokoloff, Taylor & Zafman LLP

[57] ABSTRACT

The present invention is a method and apparatus for addressing a memory array. The memory array has N rows of memory devices with different page sizes. A memory address corresponding to one of the N rows of memory devices is generated. A device bank address is selected corresponding to a device size and a device page size of the one of the N rows of memory devices.

15 Claims, 7 Drawing Sheets

| ARRAY ROW SIZE | ORGAN-IZATION ROW x COL | ROW / COL | A11 | BA1 | BA0 | A10 | A9 | A8 | A7 | A6 | A5 | A4 | A3 | A2 | A1 | A0 |
|---|---|---|---|---|---|---|---|---|---|---|---|---|---|---|---|---|
| 8MB | 12 x 8 | ROW | | | 11 | 12 | 14 | 13 | 22 | 21 | 20 | 19 | 18 | 17 | 16 | 15 |
| | | COL | | | 11 | PCHG | | 10 | 10 | 9 | 8 | 7 | 6 | 5 | 4 | 3 |
| 16MB | 12 x 9 | ROW | | | 12 | 23 | 14 | 13 | 22 | 21 | 20 | 19 | 18 | 17 | 16 | 15 |
| | | COL | | | 12 | PCHG | 11 | 11 | 10 | 9 | 8 | 7 | 6 | 5 | 4 | 3 |
| | 13 x 8 | ROW | | 12 | 11 | 23 | 14 | 13 | 22 | 21 | 20 | 19 | 18 | 17 | 16 | 15 |
| | | COL | | 12 | 11 | PCHG | | 10 | 10 | 9 | 8 | 7 | 6 | 5 | 4 | 3 |
| 32MB | 12 x 10 | ROW | | | 13 | 23 | 14 | 13 | 22 | 21 | 20 | 19 | 18 | 17 | 16 | 15 |
| | | COL | | | 13 | PCHG | 12 | 11 | 10 | 9 | 8 | 7 | 6 | 5 | 4 | 3 |
| | 14 x 8 | ROW | 13 | 12 | 11 | 23 | 14 | 13 | 22 | 21 | 20 | 19 | 18 | 17 | 16 | 15 |
| | | COL | | 12 | 11 | PCHG | | 10 | 10 | 9 | 8 | 7 | 6 | 5 | 4 | 3 |
| 64MB | 14 x 9 | ROW | 25 | 13 | 12 | 23 | 26 | 24 | 22 | 21 | 20 | 19 | 18 | 17 | 16 | 15 |
| | | COL | | 13 | 12 | PCHG | 12 | 11 | 10 | 9 | 8 | 7 | 6 | 5 | 4 | 3 |
| 128MB | 14 x 10 | ROW | 25 | 14 | 13 | 23 | 26 | 24 | 22 | 21 | 20 | 19 | 18 | 17 | 16 | 15 |
| | | COL | | 14 | 13 | PCHG | 12 | 11 | 10 | 9 | 8 | 7 | 6 | 5 | 4 | 3 |

DEVICE ADDRESS LINES

OPTIMIZING PAGE SIZE IN MIXED MEMORY ARRAY USING ADDRESS MULTIPLEXING

BACKGROUND

1. Field of the Invention

This invention relates to computer systems. In particular, the invention relates to memory controllers.

2. Description of Related Art

Synchronous dynamic random access memories (SDRAM) provide fast access time to support high performance microprocessors. Normally, SDRAMs are available with various memory organizations, ranging from 16 Megabit (Mb) to 128 Mb. A SDRAM is addressed by a row address and a column address. The number of row address lines and the number of column address lines may be different. In addition, an SDRAM may also have multiple banks. As an example, a 16 Mb SDRAM may be organized as 1M×16 having 11 row address lines, 8 column address lines, and two banks.

In a typical high performance microprocessor system, the main memory consists of an array of SDRAMs of different organizations. The use of mixed memory devices provides flexibility and memory usage efficiency. An array of SDRAMs in the main memory consists of a number of rows. Each row of the SDRAM devices may correspond to a different device organization. One row may include SDRAM devices having one depth which supports one page size. Another row may include SDRAM devices having another depth which supports another page size.

In a system having mixed types of SDRAMs, traditional memory controllers cannot support all the available page sizes. Current SDRAM controller designs fix the page size either at the smallest supported page size or the smallest page size of all the installed rows in the memory array. This prevents the memory controller from taking advantage of the larger potential page sizes which may be installed.

Therefore, there is a need in the technology to provide a simple and efficient method to support different page sizes in mixed memory devices array organization.

SUMMARY

The present invention is a method and apparatus for addressing a memory array. The memory array has N rows of memory devices with different page sizes. A memory address corresponding to one of the N rows of memory devices is generated. A device bank address is selected corresponding to a device size and a device page size of the one of the N rows of memory devices.

BRIEF DESCRIPTION OF THE DRAWINGS

The features and advantages of the present invention will become apparent from the following detailed description of the present invention in which.

DESCRIPTION

The present invention is a method and apparatus for supporting different page sizes in a mixed memory array. An address multiplexing unit selects the address lines according to the type of memory used in the array. A bank address generator and a memory address generator generate the bank address lines and the memory address lines, respectively, based on the row size and the organization of the memory devices used in the row. This technique provides flexibility in organizing the memory array.

In the following description, for purposes of explanation, numerous details are set forth in order to provide a thorough understanding of the present invention. However, it will be apparent to one skilled in the art that these specific details are not required in order to practice the present invention. In other instances, well known electrical structures and circuits are shown in block diagram form in order not to obscure the present invention.

Figure 1:
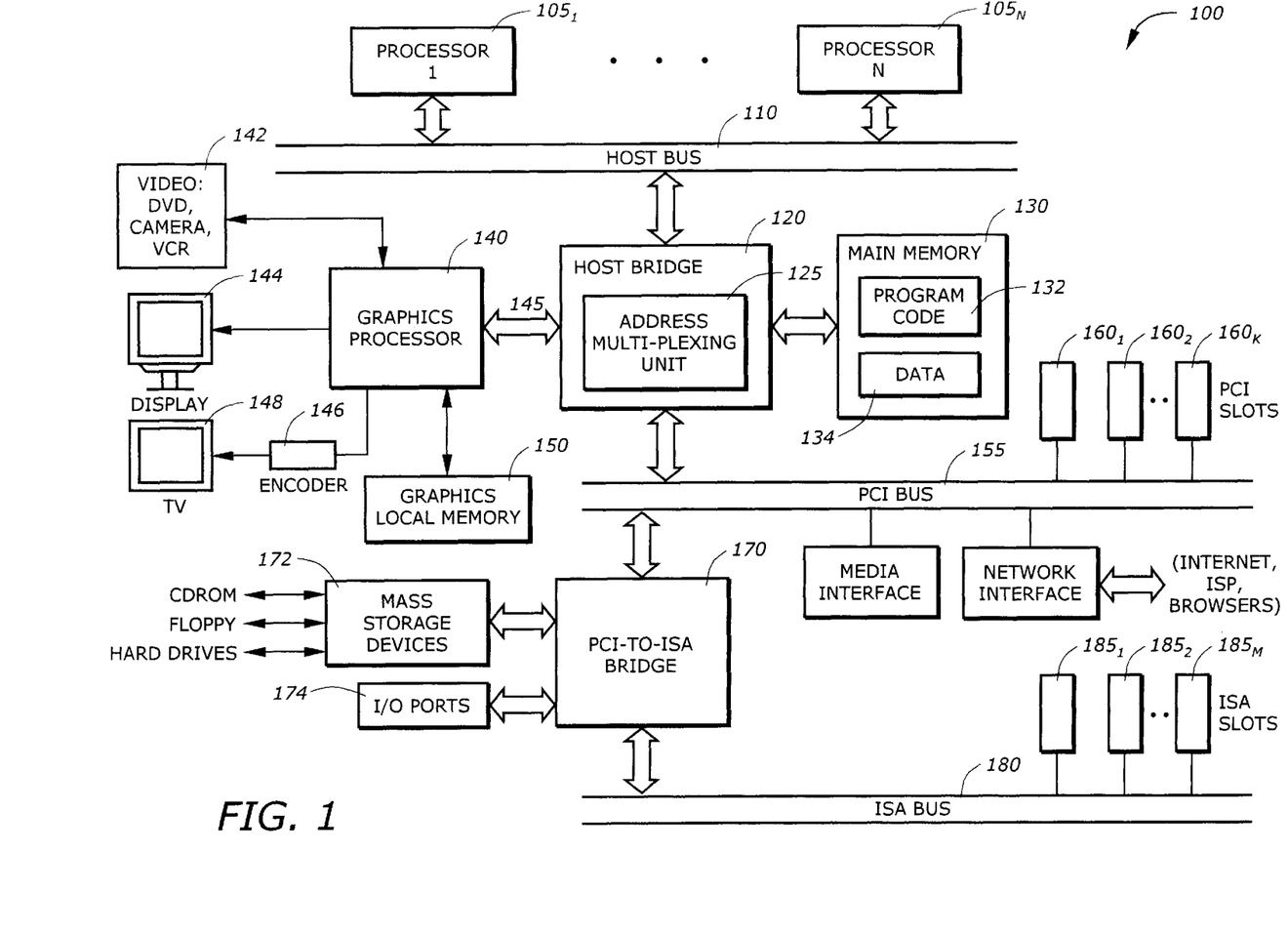
FIG. 1 is a diagram illustrating a computer system in which one embodiment of the invention can be practiced.

FIG. 1 is a diagram illustrating a computer system 100 in which one embodiment of the invention can be practiced. The computer system 100 includes N processors $105_1$ through $105_N$, a host bus 110, a host bridge 120, a main memory 130, a graphics processor 140, a video device 142, a display monitor 144, a television (TV) 148, an encoder 146, a graphics local memory 150, a PCI bus 155, K PCI slots $160_1$ to $160_K$, a PCI-to-ISA bridge 170, mass storage devices 172, Input/Output (I/O) ports 174, an ISA bus 180, and ISA slots $185_1$ to $185_M$.

Each of the processors $105_1$ to $105_N$ represents a central processing unit of any type of architecture, such as complex instruction set computers (CISC), reduced instruction set computers (RISC), very long instruction word (VLIW), or hybrid architecture or even special purpose processors such as graphics controller and digital signal processors. The invention could be implemented in a multi-processor or single processor computer system.

The host bridge 120 includes a number of interface circuits to allow the host processors $105_1$ to $105_N$ access to the main memory 130, the graphics processor 140, and the PCI bus 155. In particular, the host bridge 120 includes an address multiplexing unit 125 to interface to the main memory 130. The main memory 130 represents one or more mechanisms for storing information. For example, the main memory 130 may include non-volatile (e.g., flash memory, read only memory "ROM"), or volatile memory such as dynamic random access memory (DRAM) for example.

In one embodiment, the main memory 130 includes synchronous DRAM (SDRAM) having different page sizes. As is known by one skilled in the art, the present invention can be used for any other types of DRAM having multiple banks with varying page sizes. The main memory 130 has stored therein program code 132 and data 134. The program code 132 represents the necessary code for performing a specified task. The data 134 stores data used by the program code 132, graphics data and temporary data. Of course, the main memory 130 preferably contains additional software (not shown), which is not necessary to understanding the invention. The PCI slots $160_1$ to $160_K$ provide interfaces to PCI devices. Examples of PCI devices include a network interface 162 and a media interface 164. The network interface 162 connects to communication channel such as the Internet. The Internet provides access to on-line service providers, Web browsers, and other network channels. The media interface 164 provide access to audio and video devices.

The graphics processor 140 is a high performance graphics controller that perform graphics functions such as 3-D rendering operations, progressive meshes, painting, drawing, etc. The graphics processor 140 is coupled to the host bridge via a graphics bus 145, such as an Accelerated Graphics Port (AGP) bus developed by Intel Corporation. The graphics processor 140 has access to its own graphics local memory 150. The video device 142 provides video input such as digital video disk (DVD), camera, or video cassette recorder (VCR) to the graphics processor 140. The display monitor 144 displays the graphics as generated by the graphics processor 140. The encoder 146 receives the graphics data from the graphics controller 140 and encodes into an analog signal to be compatible for TV display on the TV set 148.

The PCI-to-ISA bridge provides access to ISA bus, mass storage devices 172, and I/O ports 174. The mass storage devices 172 include CD ROM, floppy diskettes, and/or hard drives. The ISA bus 180 has a number of ISA slots $185_1$ to $185_M$ to interface to ISA devices. Examples of ISA devices include data entry devices (e.g., keyboard, mouse), printers, etc.

Figure 2:
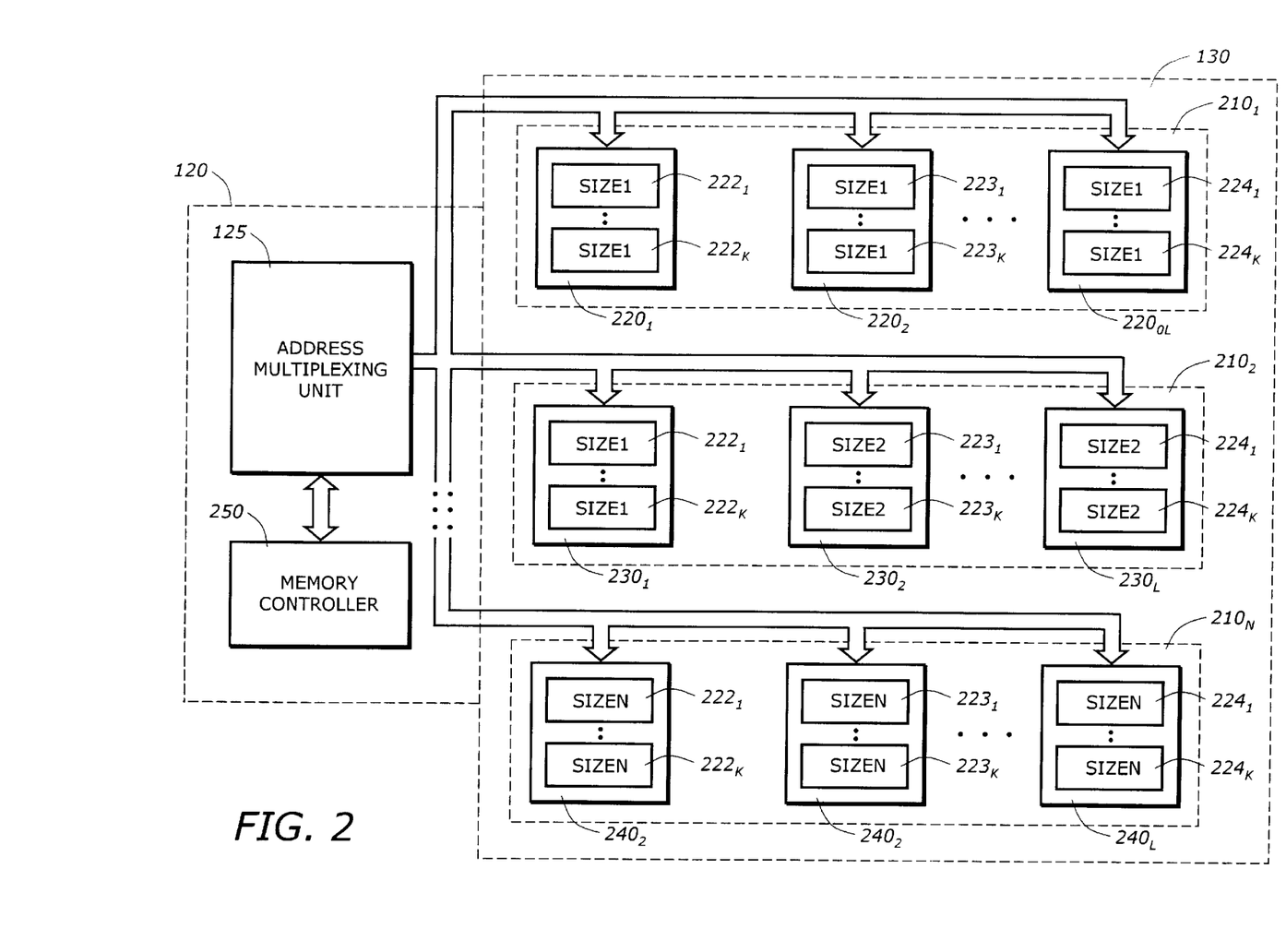
FIG. 2 is a diagram illustrating a memory array controlled by an address multiplexing unit according to one embodiment of the invention.

FIG. 2 is a diagram illustrating a memory array controlled by an address multiplexing unit according to one embodiment of the invention. The memory system includes the host bridge 120 and the main memory 130.

The host bridge 120 includes an address multiplexing unit 125 and a memory controller 250. The memory controller 250 generates the memory addresses and control signals. Examples of control signals include row address strobe (RAS#), column address strobe (CAS#), etc.

The main memory 130 includes an array of memory devices organized in a N rows. The memory array includes row $210_1, 210_2, \ldots, 210_N$. Each row includes a number of memory devices having the same organization. In one embodiment, the memory devices in each row are SDRAMs. The internal organization of the memory devices in one row may be different from that of in another row.

In the exemplary embodiment shown in FIG. 2, row $210_1$ includes L memory devices $220_1, 220_2, \ldots, 220_L$, row $210_2$ includes L memory devices $230_1, 230_2, \ldots, 230_L$, and row $210_N$ includes memory devices $240_1, 240_2, \ldots, 240_L$. Each of the memory devices $220_1, \ldots 220_L$ includes a number of pages having a size SIZE1. Each of the memory devices $230_1, \ldots 230_L$ includes a number of pages having a size SIZE2. Each of the memory devices $240_1, \ldots 240_L$ includes a number of pages having a size SIZEN. As shown in FIG. 2, the memory device $220_1$ has pages $222_1$ to $222_K$ each with size SIZE1, the memory device $230_1$ has pages $232_1$ to $232_P$ with size SIZE2, and the memory devices $240_1$ has pages $242_1$ to $242_Q$ with size SIZEN.

Figure 3:
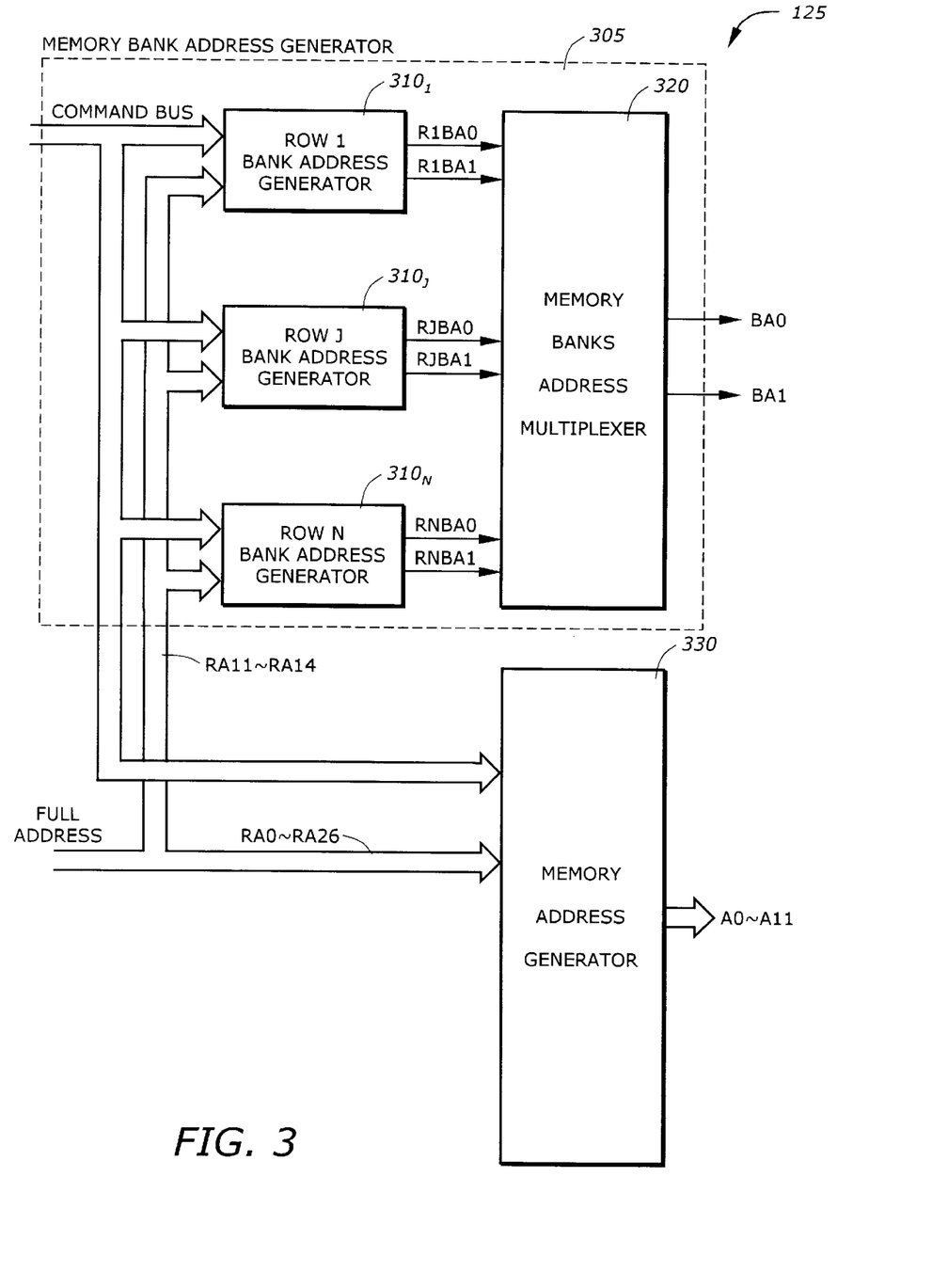
FIG. 3 is a diagram illustrating an address multiplexing unit according to one embodiment of the invention.

FIG. 3 is a diagram illustrating an address multiplexing unit 125 according to one embodiment of the invention. The address multiplexing unit 125 includes a memory bank address generator 305 and a memory address generator 330.

The memory bank address generator 305 generates the bank addresses BA0 and BA1. The memory bank address generator 305 includes N row bank address generators $310_1$ to $310_N$ and a memory bank address multiplexer 320. Each of the row bank address generators $310_1$ to $310_N$ receives the control data from the memory controller 250 (FIG. 2) via the command bus, and the row addresses RA11 to RA14 from the memory controller 250 via the row address bus. The row bank address generators $310_1$ to $310_N$ generate the row bank addresses R1BA0, R1BA1, to RNBA0, RNBA1, respectively. The memory bank address multiplexer receives the row bank addresses R1BA0, R1BA1 to RNBA0, RNBA1 and generates the memory bank addresses BA0 and BA1.

The memory address generator 330 receives the control data from the memory controller 250 (FIG. 2) via the command bus and the row addresses RA0 to RA26 via the row address bus. The memory address generator 330 generates the memory addresses A0 to A11.

Address Multiplexing

The multiplexing scheme allows for each row to be supported with the maximum page size allowed in each row. The multiplexing scheme is based on the selection of the address lines as generated by the memory controller to connect to the address lines of the memory devices. The selection, or switching, is based on a predetermined address mapping according to the particular device organization. A multiplexer or a selecting element is used to select an output from a number of inputs.

A SDRAM device has an organization that supports a memory size and a page size. A SDRAM device typically has a multiple banks. The following table shows an organization of SDRAM devices. In the following table, "NOB" is the number of banks, "BA" is the number of bank address lines, "Row" is the number of row address lines, and "Col" is the number of column address lines.

| Memory size | NOB | BA | Row | Col |
|---|---|---|---|---|
| 16M 2 banks | | | | |
| 1M × 16 | 2 | 1 | 11 | 8 |
| 2M × 8 | 2 | 1 | 11 | 9 |
| 4M × 4 | 2 | 1 | 11 | 10 |
| 64M × banks | | | | |
| 2M × 32 | 2 | 1 | 11 | 9 |
| 4M × 16 | 2 | 1 | 11 | 10 |
| 8M × 8 | 2 | 1 | 13 | 9 |
| 16M × 4 | 2 | 1 | 13 | 10 |
| 64M 4 banks | | | | |
| 2M × 32 | 4 | 2 | 11 | 8 |
| 4M × 16 | 4 | 2 | 12 | 8 |
| 8M '3 8 | 4 | 2 | 12 | 9 |
| 16M × 4 | 4 | 2 | 12 | 10 |
| 128M 4 banks | | | | |
| 4M × 32 | 4 | 2 | 12 | 8 |
| 8M × 16 | 4 | 2 | 12 | 9 |
| 16M × 8 | 4 | 2 | 12 | 10 |

The address lines generated by the memory controller correspond to linear address. For example, suppose the memory space is 64 MB, then the total number of address lines is 26, from RA0 to RA25. A typical DRAM has row and column addresses. The linear address lines RA0 to RA25 are to be mapped to the device row address lines and column address lines at the RAS# and CAS# strobes.

The address mapping of the array address lines to the device address lines is determined by examining the device organization for the particular configuration of the memory array. The address lines are switched to connect the proper address lines to the device address lines according to the row being addressed.

Figure 4A:
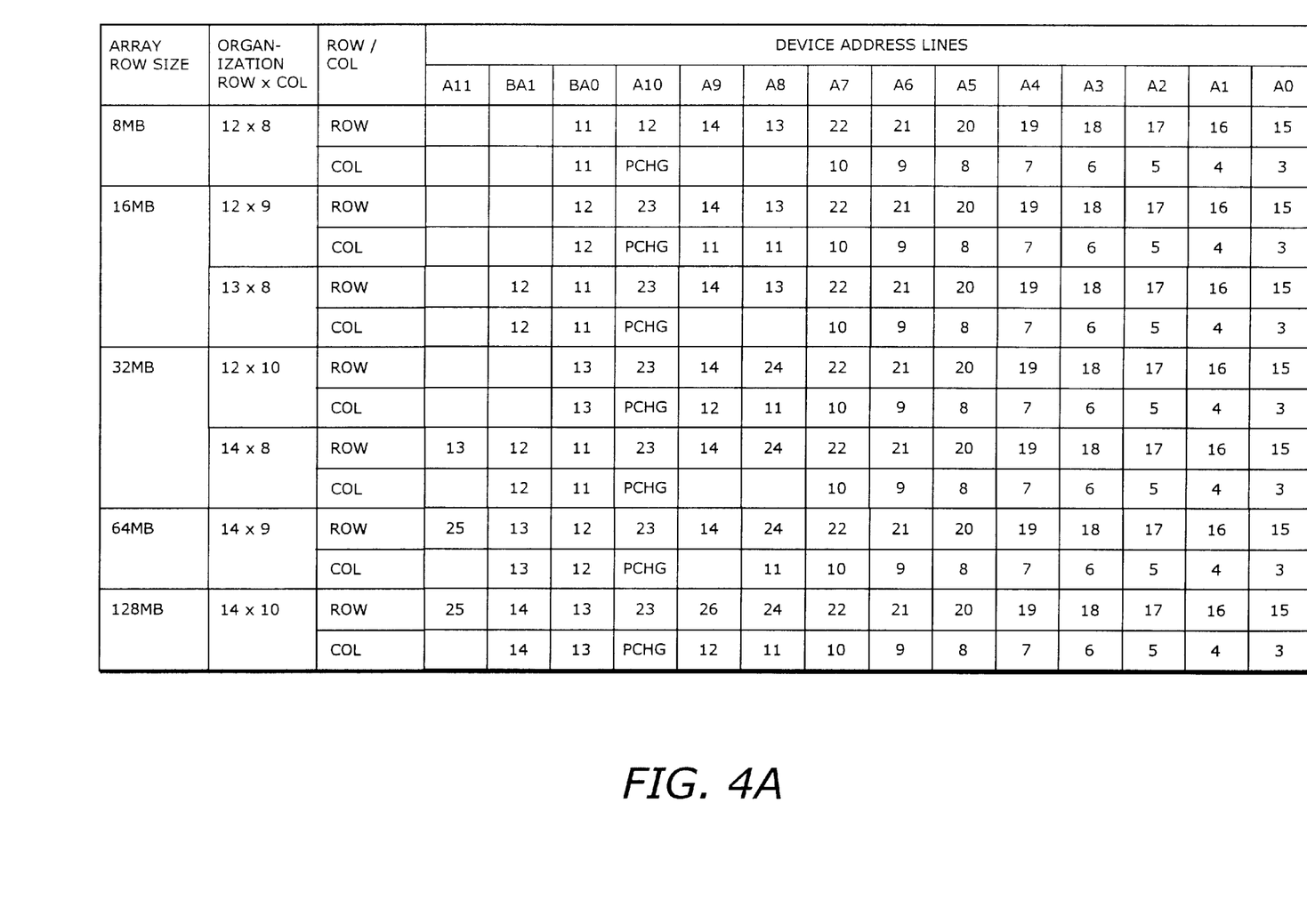
FIG. 4A is a diagram illustrating an address mapping according to one embodiment of the invention.

FIG. 4A is a diagram illustrating an address mapping 400 according to one embodiment of the invention. The address mapping 400 accommodates three page sizes.

Assuming the memory array is 64-bit wide. The memory devices with 8, 9, and 10 column address lines have a page size of 2 kilobytes (KB), 4 KB, and 8 KB, respectively. This page size determines what address lines are switched or multiplexed onto the bank address lines BA[1:0].

The device address lines A0–A7 are mapped to the same row and column address lines for all the memory sizes. The address lines A0–A7 are referred to as the group 0 addresses. The address lines A8–A11 are mapped to different row and column address lines according to the memory and page sizes. The address lines A8–A11 are referred to as the group 1 addresses. The bank address lines BA[1:0] are mapped to different row and column address lines according to the memory and page sizes.

Figure 4B:
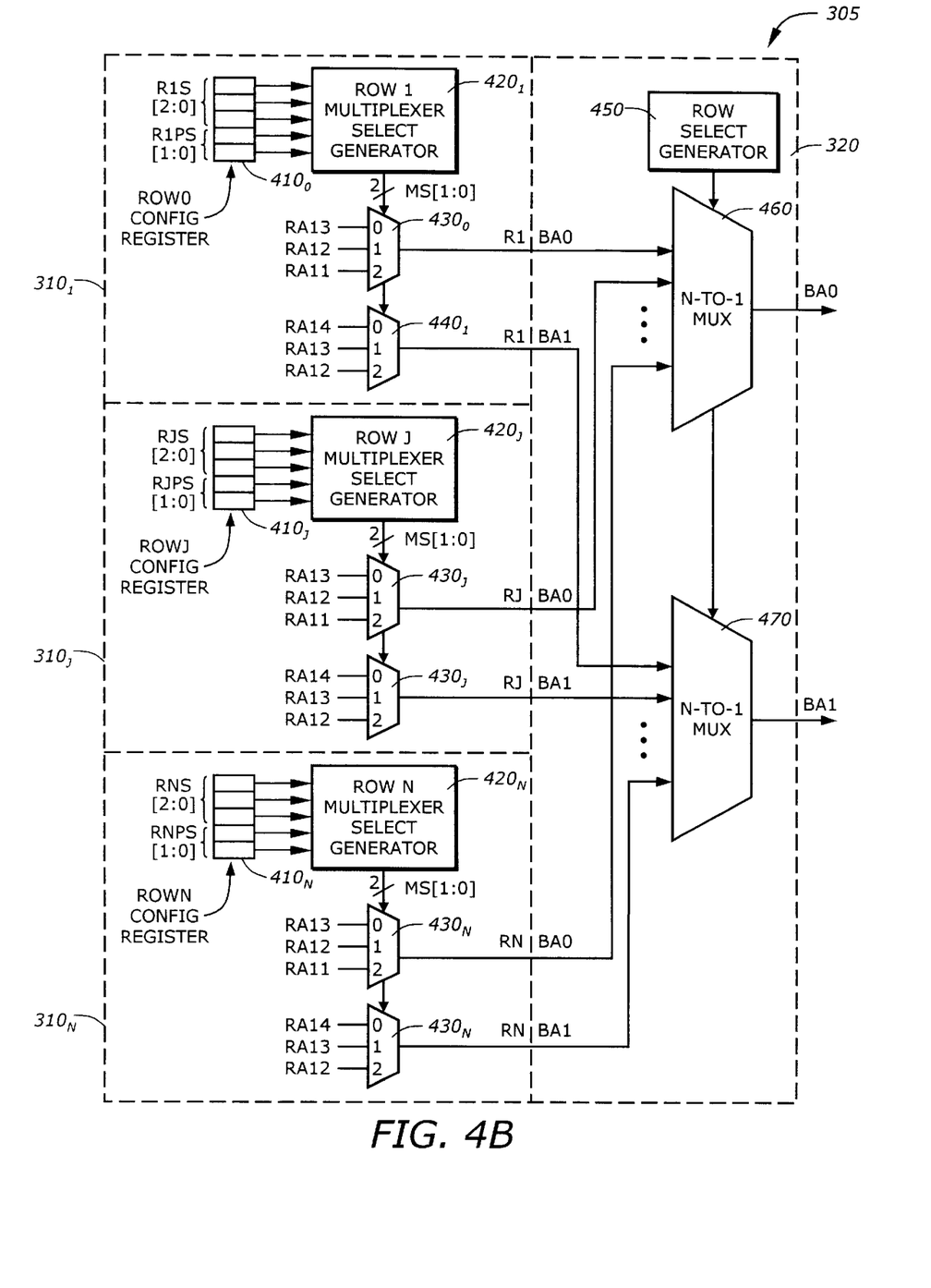
FIG. 4B is a diagram illustrating a memory bank address generator according to one embodiment of the invention.

FIG. 4B is a diagram illustrating a memory bank address generator 305 according to one embodiment of the invention. The memory bank address generator 305 includes N row bank address generators 310१ to 310N and the memory bank address multiplexer 320.

The row bank address generators $310_1$ to $310_N$ are essentially similar. Each of the row bank address generators $310_1$ to $310_N$ corresponds to each row of the memory array. The row J bank address generator $310_J$ corresponds to row J of the memory array and includes a row J configuration register $410_J$, a row J multiplexer select generator $420_J$, and multiplexers $430_J$ and $440_J$.

The row J configuration register $410_J$ stores the configuration data as written by the memory controller or the host processor during initialization via the command bus. The configuration data include the size, or organization, and the page size of the memory devices used in the corresponding row. In one embodiment, the row J configuration register $410_J$ includes five bits: three bits (RJS[2:0]) for the memory size and two bits (RJPS[1:0]) for page size. In this configuration, the memory array can accommodate eight different memory sizes and four different page sizes. Of course, more memory and page sizes can be accommodated using more bits in the configuration register.

The row J multiplexer select generator $420_J$ receives the configuration data from the row J configuration register $410_J$ and generates the select lines MS[1:0] for the multiplexers $430_J$ and $440_J$. The row J multiplexer select generator $420_J$ is a combinational logic circuit to control the switching of the row address lines RA11–RA14 to the row bank address lines RJBA[1:0].

The multiplexer $430_J$ selects the row address lines RA11, RA12, and RA13 to the row bank address RJBA0. The multiplexer $440_J$ selects the row address lines RA12, RA13, and RA14 to the row bank address RJBA1. The selection is performed based on the MS[1:0] generated by the row J multiplexer select generator $420_J$.

The N row bank address generators $310_1$ to $310_N$ generates N row bank address lines R0BA[1:0] to RNBA[1:0]. These row bank address lines R0BA[1:0] to RNBA[1:0] go to the memory bank address multiplexer 320.

The memory bank address multiplexer 320 includes a row select generator 450 and two multiplexers 460 and 470. The row select generator 450 is a combinational logic circuit that generates the select lines for the multiplexers 460 and 470 based on the memory address lines. The multiplexers 460 and 470 generate the device bank address lines BA0 and BA1, respectively. Each of the multiplexers 460 and 470 is a N-to-1 multiplexer which selects the row bank address lines R0BA[1:0] to RNBA[1:0]. The multiplexer 460 selects from the R0BA0 to RNBA0 and the multiplexer 470 selects from the R0BA1 to RNBA1.

Figure 5:
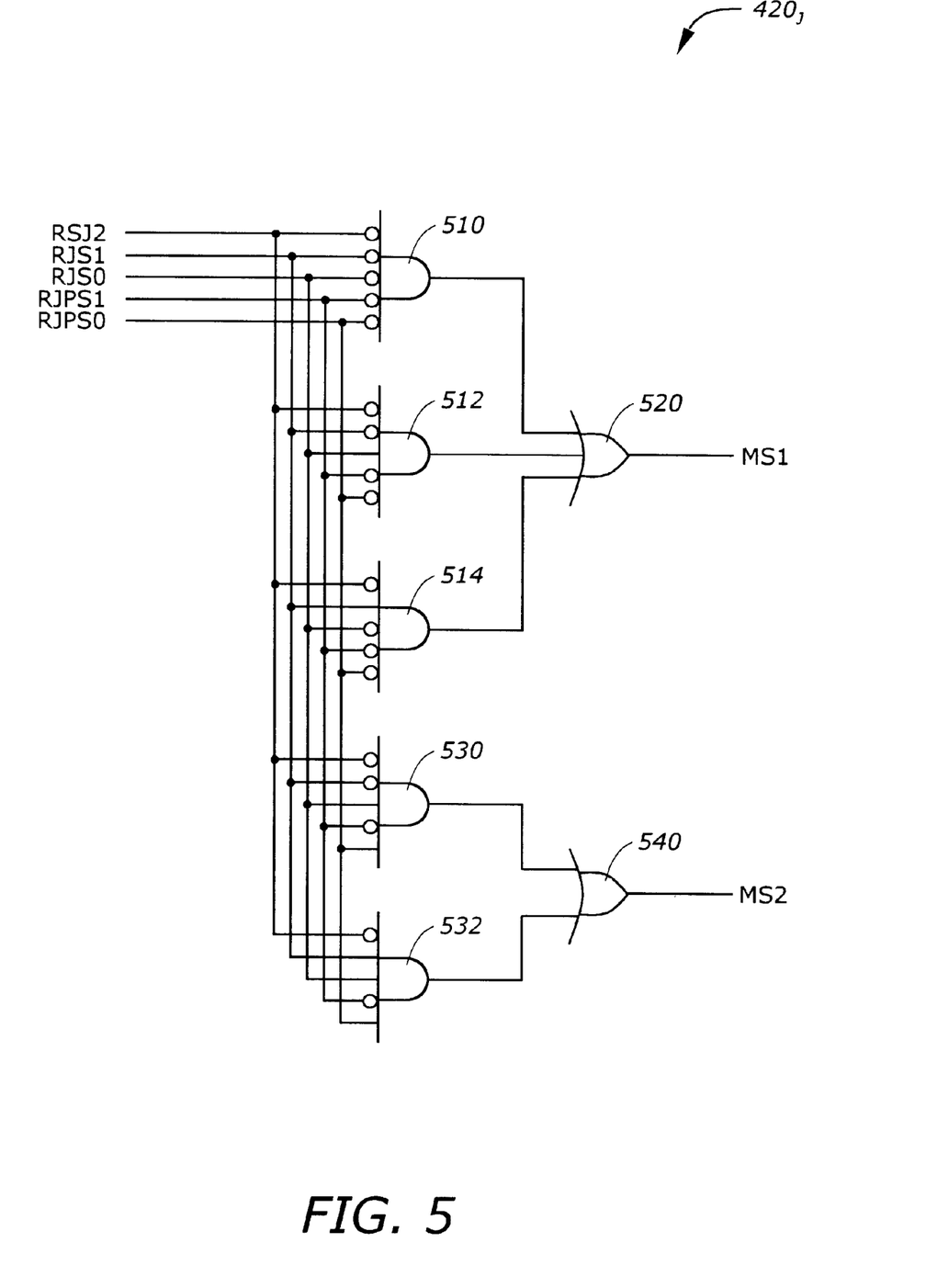
FIG. 5 is a diagram illustrating a row multiplexer select generator according to one embodiment of the invention.

FIG. 5 is a diagram illustrating a row multiplexer select generator 420 according to one embodiment of the invention. The row multiplexer select generator 420 includes AND gates 510, 512, 514, 530, and 532, and two OR gates 520 and 540.

The row multiplexer select generator 420 receives the encoded row size bits RS2–RS0 and the encoded row page size bits RPS1–RPS0 and generates the multiplexer select lines MS0–MS1. The multiplexer select lines MS0–MS1 are used to select all the multiplexers for the bank address. The decoding of the encoded row size bits RS2–RS0 and the encoded row page size bits RPS1–RPS0 is carried out according to the following table.

|      | RS2-0 | RPS1-0 | Page size | MS1-0 | BA1  | BA0  |
|------|-------|--------|-----------|-------|------|------|
| 8M   | 0 0 0 | 0 0    | 2 KB      | 1 0   | X    | RA11 |
| 16M  | 0 0 1 | 0 0    | 2 KB      | 1 0   | RA12 | RA11 |
|      |       | 0 1    | 4 KB      | 0 1   | X    | RA12 |
| 32M  | 0 1 0 | 0 0    | 2 KB      | 1 0   | RA12 | RA11 |
|      |       | 1 0    | 8 KB      | 0 0   | X    | RA13 |
| 64M  | 0 1 1 | 0 1    | 4 KB      | 0 1   | RA13 | RA12 |
| 128M | 1 0 0 | 1 0    | 8 KB      | 0 0   | RA14 | RA13 |

The above table represents one way to decode the row size bits RS2-0 and row page size bits RPS1-0. Other decodings are possible.

From the above table, the equations for MS0–MS1 can be written as follows:

$$MS1 = RS2'\ RS1'RS0'\ RPS1'\ RPS0' + RS2'\ RS1'\ RS0\ RPS1'\ RPS0' + RS2'\ RS1\ RS0'\ RPS1'\ RPS0' \quad (1)$$

$$= RS2'\ RPS1'\ RPS0'\ (RPS1'\ RPS0' + RPS1'\ RPS0' + RPS1'\ RPS0')$$

$$MS0 = RS2'\ RS1'\ RS0\ RPS1'\ RPS0 + RS2'\ RS1\ RS0\ RPS1'\ RPS0' \quad (2)$$

where ' denotes complement operation.

The AND gates 510, 512, and 514 and the OR gate 520 are used to realize the logic equation (1) for MS1. The AND gates 530 and 532 and OR gate 540 are used to realize the logic equation (2) for MS0.

Figure 6:
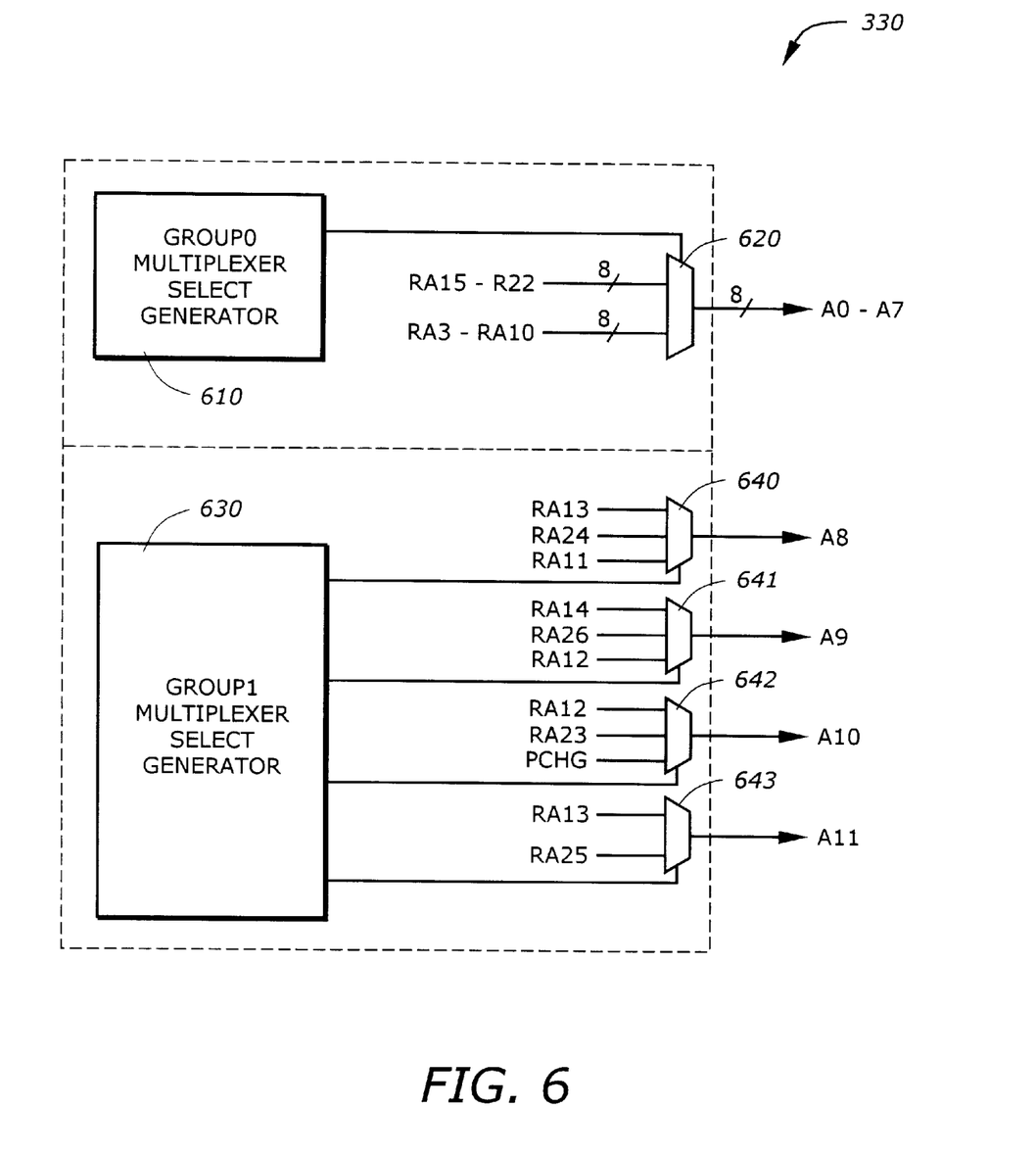
FIG. 6 is a diagram illustrating a memory address generator according to one embodiment of the invention.

FIG. 6 is a diagram illustrating a memory address generator 330 according to one embodiment of the invention. The memory address generator 330 includes a group0 multiplexer select generator 610, a multiplexer 620, a group1 multiplexer select generator 630, and four multiplexers 640, 641, 642, and 643.

The group0 multiplexer select generator 610 generates the select line to the multiplexer 620. The multiplexer 620 is a two-to-one multiplexer to select between the row address lines RA15–RA22 and RA3–RA10 to the memory address lines A0–A7. The multiplexing of the row address lines is synchronized with the row and column address strobes of the DRAM devices, e.g., the RAS# and CAS# strobes. The address lines A0–A7 belong to group 0 which includes the device address lines that are connected to the same row address lines for all memory device organization.

The group1 multiplexer select generator 630 generates the select lines to the four multiplexers 640, 641, 642, and 643. The group1 multiplexer select generator 630 includes circuitry to receive command data regarding the specific memory type for each row. The multiplexers 640, 641, 642, and 643 generate the address lines A8–A11. The multiplexing of the row address lines is synchronized with the row and column address strobes of the DRAM devices, e.g., the RAS# and CAS# strobes. In addition, it is also dependent on the memory type, or device organization, used for each row.

The address lines A8–A11 belong to group 1 which includes the device address lines that are connected to different row address lines depending on the device organization.

Therefore, the present invention is a technique to address a memory array having memory devices with different page sizes. The address mapping is used to multiplex the address lines to the device address lines according to the memory size and the page size of the devices in the row. The technique allows efficient usage of page size in a mixed memory array having different device memory sizes and page sizes.

While this invention has been described with reference to illustrative embodiments, this description is not intended to be construed in a limiting sense. Various modifications of the illustrative embodiments, as well as other embodiments of the invention, which are apparent to persons skilled in the art to which the invention pertains are deemed to lie within the spirit and scope of the invention.

What is claimed is:

1. A method for addressing a memory array having N rows of memory devices with different page sizes, the method comprising:

generating a memory address corresponding to one of the N rows of memory devices; and selecting a device bank address corresponding to a device size and a device page size of the one of the N rows of memory devices.

2. The method of claim 1 further comprising:

generating a device address corresponding to the device size and the device page size of the one of the N rows of memory devices.

3. The method of claim 2 wherein selecting of the device bank address comprising:

generating N row bank addresses corresponding to the N rows of memory devices; and generating a first row select to a first row selecting element to select the device bank address from the N row bank addresses.

4. The method of claim 3 wherein the generating of the N row bank addresses comprises:

generating one of the N row bank addresses corresponding to the device size and the device page size.

5. The method of claim 4 wherein the generating of one of the N row bank addresses comprises:

encoding the device size and the device page size in a configuration register; and generating a second row select to a second selecting element to select the one of the N row bank addresses.

6. An apparatus for addressing a memory array having N rows of memory devices with different page sizes, the apparatus comprising:

a bank address generator to receive a memory address corresponding to one of the N rows of memory devices, the bank address generator comprising:

a circuit for selecting a device bank address corresponding to a device size and a device page size of the one of the N rows of memory devices.

7. The apparatus of claim 6 further comprising:

a device address generator coupled to receive the memory address, the device address generator generating a device address corresponding to the device size and the device page size of the one of the N rows of memory devices.

8. The apparatus of claim 7 wherein the bank address generator comprises:

N row bank address generators for generating N row bank addresses corresponding to the N rows of memory devices;

a first row selecting element coupled to the N row bank address generators to select the device bank address from the N row bank addresses; and a first row select generator coupled to the first row selecting element for generating a first row select, the first row select controlling a selection of the first row selecting element.

9. The apparatus of claim 8 wherein one of the N row bank address generators generates one of the N row bank addresses corresponding to the device size and the device page size.

10. The apparatus of claim 9 wherein the one of the N row bank addresses generators comprises:

a configuration register for encoding the device size and the device page size;

a second row selecting element to select the one of the N row bank addresses; and a second row select generator coupled to the second selecting row element for generating a second row select, the second row select controlling a selection of the second row selecting element.

11. A system comprising:

a memory array having N rows of memory devices with different page sizes;

a memory controller coupled to the memory array for generating a memory address; and an address multiplexing unit coupled to the memory controller and the memory array, the address multiplexing unit comprising:

a bank address generator coupled to receive a memory address corresponding to one of the N rows of memory devices, the bank address generator selecting a device bank address corresponding to a device size and a device page size of the one of the N rows of memory devices.

12. The system of claim 11 wherein the address multiplexing unit further comprising:

a device address generator coupled to receive the memory address, the device address generator generating a device address corresponding to the device size and the device page size of the one of the N rows of memory devices.

13. The system of claim 12 wherein the bank address generator comprises:

N row bank address generators for generating N row bank addresses corresponding to the N rows of memory devices;

a first row selecting element coupled to the N row bank address generators to select the device bank address from the N row bank addresses; and a first row select generator coupled to the first row selecting element for generating a first row select, the first row select controlling a selection of the first row selecting element.

14. The system of claim 13 wherein one of the N row bank address generators generates one of the N row bank addresses corresponding to the device size and the device page size.

15. The system of claim 14 wherein the one of the N row bank addresses generators comprises:

a configuration register for encoding the device size and the device page size;

a second row selecting element to select the one of the N row bank addresses; and a second row select generator coupled to the second row selecting element for generating a second row select, the second row select controlling a selection of the second row selecting element.

* * * * *